(12) United States Patent
Takagi et al.

(10) Patent No.: US 6,402,847 B1
(45) Date of Patent: Jun. 11, 2002

(54) DRY PROCESSING APPARATUS AND DRY PROCESSING METHOD

(75) Inventors: Shigeyuki Takagi, Fujisawa; Makoto Saito, Yokohama; Seiji Onoue, Yokohama; Ichiro Tohno, Yokohama; Hiroshi Nishimura, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/449,746

(22) Filed: Nov. 26, 1999

(30) Foreign Application Priority Data

Nov. 27, 1998 (JP) ............................. 10-336986
Dec. 21, 1998 (JP) ............................. 10-362785
Jun. 18, 1999 (JP) ............................. 11-172692

(51) Int. Cl.[7] .............................. C23C 16/00

(52) U.S. Cl. ................ 118/715; 118/723 R; 118/723 G

(58) Field of Search ................ 118/715, 728, 118/723 E, 723 R; 156/345

(56) References Cited

U.S. PATENT DOCUMENTS

| 4,854,263 A | * | 8/1989 | Chang et al. | ............... 118/715 |
| 5,441,568 A | * | 8/1995 | Cho et al. | ................... 118/715 |
| 5,846,332 A | | 12/1998 | Zhao et al. | |
| 6,117,244 A | * | 9/2000 | Bang et al. | ................. 118/715 |

* cited by examiner

Primary Examiner—Gregory Mills
Assistant Examiner—Sylvia R MacArthur
(74) Attorney, Agent, or Firm—Oblon, Spivak, McClelland, Maier & Neustadt, P.C.

(57) ABSTRACT

A dry processing apparatus includes a lower electrode for holding a substrate to be processed in a chamber, a shower head, provided to face a surface of the lower electrode, on which the substrate to be processed is placed, for supplying a process gas to the substrate to be processed, placed on the lower electrode, and a pumping channel formed to surround an outer circumference of the lower electrode, wherein a pumping gap portion for communicating a processing space formed between the lower electrode and the shower head, and the pumping channel with each other, is made such that a width of the gap portion differs between an exhaust pump side where the pumping channel is connected to an exhaust pump, and an opposite side thereto.

7 Claims, 8 Drawing Sheets

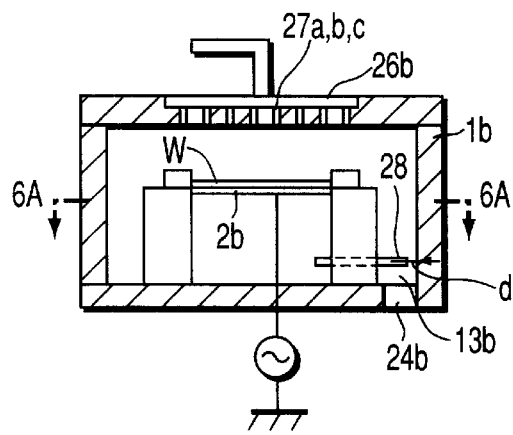
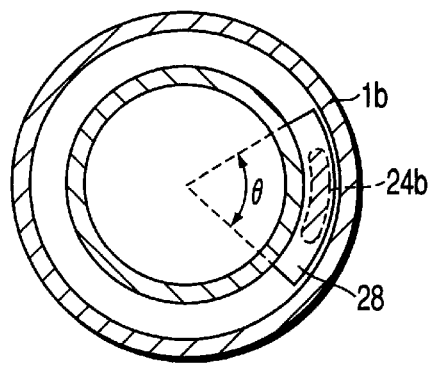
FIG. 6A          FIG. 6B
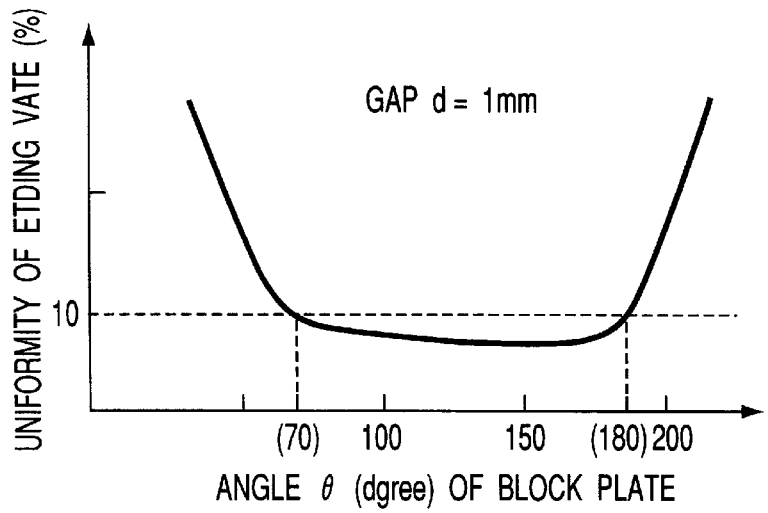
FIG. 7A
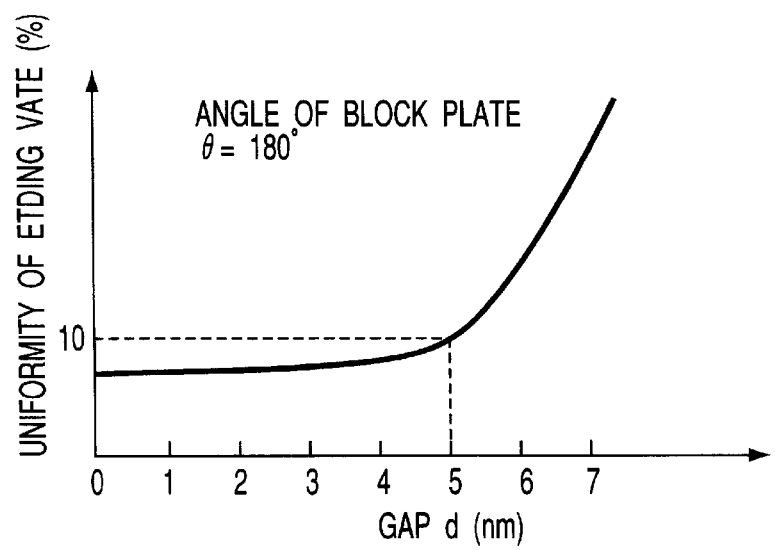
FIG. 7B

DRY PROCESSING APPARATUS AND DRY PROCESSING METHOD

BACKGROUND OF THE INVENTION

The present invention relates to a dry processing apparatus such as a film forming apparatus or etching apparatus, and a dry processing method.

A CVD (chemical vapor deposition) apparatus, which is an example of the dry processing apparatus, is disclosed in, for example, Jpn. Pat. Appln. KOKAI Publication No. 10-70088. In this CVD apparatus, a liner made of an insulating material is provided between the main chamber and a pumping flow path arranged around the chamber, for the purpose of shutting heat or plasma. Thus, the generation of a precipitate in the pumping flow path is suppressed.

In the above-described CVD apparatus, a process gas flows through a nozzle of a shower head to a chamber of a processing region. The process gas flown into the chamber traverses an edge of a wafer placed on a lower electrode to flow outwards in a radial direction of the wafer, and goes over a centering situated at a ring-like shelf portion formed on the outer circumference of an upper section of the lower electrode. Then, the gas flows into the pumping flow path, and proceeds through the outer circumference of the processing chamber. After that, the gas is exhausted by a vacuum pump device connected to the process chamber.

In such a CVD apparatus, when the film forming process is continued, depositions accumulate on the inner wall of the chamber or in the pumping flow path, and thus an unevenness is created in the electro-conductivity of the chamber and the flow of the gas. As a result, the surface of a thin film formed on the wafer is adversely affected in terms of evenness or the like. In order to avoid this, when depositions accumulate to have a certain thickness or more in, for example, the vicinity of the lower electrode in the chamber, it becomes necessary to remove such deposition by cleaning with the process gas which is made to flow. Such a cleaning operation is carried out periodically.

However, between the film formation and cleaning, the flow rate of the process gas, the distance between the shower head and the lower electrode, and the like varies, and therefore the flowing manner of the process gas varies to become uneven, and there created some sections in the pumping flow path, where they cannot be easily cleaned. Therefore, drawbacks such as that a cleaning time is prolonged and dusts are easily created in sections in the pumping flow path, where the gas flow is stagnant.

Further, when the introduction of the process gas is stopped just after the completion of the process and the gas is exhausted to ultimate pressure, the gas exhaustion becomes, in some cases, uneven depending upon the position of the exhaust outlet, thus unsettling the gas flow rate distribution. For this reason, dusts generated in the space above the wafer during the process pass above the wafer for a long distance until the ultimate pressure is obtained by exhaustion, and therefore the probability that dusts attach onto the surface of the wafer increases.

Meanwhile, there is a CVD apparatus having a chamber in which a lower electrode on which a wafer is placed, is contained, and a gas introduction path is provided for the upper section of the chamber, whereas an exhaustion hole is made in the lower section thereof. In such the apparatus, an exhaustion plate having a plurality of exhaustion holes is provided at a central portion of the chamber so as to uniform the gas flow around the wafer. However, this technique entails a drawback in which depositions are attached to the exhaust plate, thus making the time required to remove the depositions longer. Thus, the utility of the process gas is low.

Further, dusts and the like, which are created from peeled-off depositions once attached to the surface of, for example, the inner wall of the chamber, attach to a wafer being subjected to film formation.

In the meantime, another example of the dry process apparatus is an etching device, which generates activated species such as of radicals or ions by plasma generated by exciting the process gas (medium gas), and carries out the etching of the wafer, which is an object to be processed.

As shown in FIG. 25, the etching apparatus 301 has a chamber 302, into which a process gag such as fluorocarbon is introduced, for example, over the upper end side, from a gas supply tube path 303.

In the chamber 302, a process stage 305 is provided as a holding means for holding a wafer W. The process stage 305 is designed to hold a wafer W with its upper end surface, and the holding section which holds the wafer W serves as a lower electrode 306. To the lower electrode 306, an RF power 307 provided on an outer side of the chamber 302 is electrically connected, so as to make it possible to apply a high-frequency voltage to the lower electrode 306.

In a lower side of the chamber 302, a gas exhaust pipe path 308 for exhausting a gas introduced to the chamber 302 and for maintaining the inside of the chamber at a predetermined pressure, is provided. The gas exhaust pipe path 308 is connected to a suction means, which is not shown, thereby the interior of the chamber 302 can be vacuum-suctioned.

In such an etching apparatus 301, the process gas introduced from the gas supply tube path 303 is excited into plasma by the RF power 307 which applies power to the lower electrode 306, and the activated species such as activated atoms (radicals) and ions, generated by the plasma, are carried by the gas flow directed to the gas exhaustion pipe path 308, thereby processing the wafer W placed on the lower electrode 306.

In usual cases, the gas flow rate within the apparatus is high on the exhaustion side, and therefore the etching rate is biased within the surface of the wafer W in some cases, depending upon the type of the process.

Further, as to the relationship between the gas flow rate and the etching rate on the surface of the wafer W placed in the process chamber, the process gas supplied from the gas supply inlet into the process chamber is allowed to pass above the surface of the wafer W placed on the lower electrode 306, and then exhausted from the gas exhaust pipe path 308. With this structure, the flow of the process gas on the surface of the wafer W is faster on the exhaust pipe path 308 side, whereas it is slower on the opposite side. In processes in which activated species are sufficiently supplied, the etching rate within the surface can be made uniform. However, in processes with an insufficiently amount of activated species generated, a great number of activated species move across the section where the gas flow is fast, thus increasing the etching rate there. As a result, the etching amount becomes uneven.

In order to prevent such an unevenness of the etching amount, the following technique has been proposed. That is, a baffle plate 309 is provided at a position between an circumferential wall of the process stage 305 in the chamber 302, and the inner wall of the chamber 302 so as to uniform the gas flow by suppressing the bias of the gas flow, which occurs due to the position where the gas exhaustion pipe path 308 is situated, and to restrict the passing of the plasma (charged particles) to the exhaust pipe path 308 side.

The baffle plate 309 is designed to be situated between the circumferential wall of the process stage 305 and the inner wall of the chamber 302, and therefore it has a ring-like shape. Further, the baffle plate 309 has slits 310 formed therein to be directed outwards from the center of the diameter of the ring-like shape. Each slit 310 is formed to have such a width that it is no more than two times the sheath thickness of the plasma generated within the chamber 302, and this structure prevents plasma from being exhausted as it is allowed to pass the exhaust pipe tube 308.

The cross sectional shape of each slit 310 is as shown in FIG. 26, and it is designed that the width is made narrow on one surface side (upper side in the figure), whereas the width is made wide on the other surface side (lower side) so as to be able to suction the process gas efficiently. As a result, the cross sectional shape of the baffle plate 309 has approximately a T-letter shape as can be seen in FIG. 26. Such a slit 310 is made over the entire circumference of the baffle plate 309 at a predetermined pitch.

However, since fluorine-based compounds such as $CF_4$ and $CHF_3$ are used in etching, fluorocarbon generated by recombination of activated species which were once decomposed, and product materials generated in etching reactions adhere to the inner wall surface of the chamber 302 and the baffle plate 309. Therefore, when the dry process device is operated for a long period of time, product materials are deposited on the upper section of the baffle plate 309 as shown in FIG. 27 along with time, and eventually slits 310 made in the baffle plate 309 are filled with the deposition of the product materials.

When the filling of the slits 310 due to the attachment of the product material, occurs, the gas pressure the discharge section increases along with time elapse, and therefore the processing conditions vary due to the increase in the gas pressure. If the processing conditions vary in this manner, problems such as an unevenness of the etching rate and variation of the rate are created.

In order to avoid this, the baffle plate 309 is removed from the interior of the chamber 302 periodically, and subjected to cleaning. However, it requires 5 hours or more from the replacement of the baffle plate 309 to the start of the operation of the dry processing apparatus, and therefore there is a great demand of a baffle plate which requires replacement less frequently and a shorter cleaning time.

BRIEF SUMMARY OF THE INVENTION

The first object of the present invention is to minimize the area to where deposition materials attach, and to carry out the elimination of the deposition materials in an efficient manner, regardless of the process gas used, process condition, the structure of the process chamber, or the change in the pressure in the chamber.

The present invention is a dry processing apparatus including: holding means for holding a substrate to be processed in a chamber; gas supply means, provided to face a surface of the holding means, on which the substrate to be processed is placed, for supplying a process gas to the substrate to be processed, placed on the holding means; and a pumping flow path formed to surround an outer circumference of the holding means, wherein a pumping gap section for communicating a processing space formed between the holding means and the supply means, and the pumping flow path with each other, is made such that a width of the gap section differs between an exhaustion outlet side where the pumping flow path is connected to an exhaustion outlet, and an opposite side thereto.

According to the present invention, the pumping gap portion through which the process gas flows, is controlled on the exhaustion pump side and the opposite side, and therefore the flow of gas during the film formation can be made similar to that of the cleaning. In this manner, the cleaning can be carried out assuredly at a section to be cleaned, and the removal of dusts created can be accurately carried out. Further, the time required for these operations can be shortened.

Further, with the above-described structure, the distance in which dusts generated in a space above the wafer during the process pass over the wafer when the gas is exhausted to the ultimate pressure becomes minimum. In addition, the wall surface and the like, other than the counter electrode to which deposition materials and particles attached, are separated from the wafer by slits. Therefore, the probability that dusts attach to the wafer can be decreased.

The second object of the present invention is to realize a uniform exhaustion which is not influenced by the position of the exhaust outlet, and thereby to uniform the etching rate.

The present invention is a dry processing apparatus including: holding means for holding a substrate to be processed in a chamber; gas supply means, provided to face a surface of the holding means, on which the substrate to be processed is placed, for supplying a process gas to the substrate to be processed, placed on the holding means; and an exhaustion outlet for exhausting the interior of the chamber, wherein a block plate for covering the exhaustion outlet is provided on an upstream side of the exhaustion outlet.

According to the present invention, with the block plate, the uniformity of the etching rate within the surface can be significantly improved, and therefore an effect that, for example, the process is stabilized to improve the yield in the apparatus manufacture, can be obtained.

The third object of the present invention is to prolong the time up to which a slit is filled with the deposition material produced during process.

The present invention is a dry processing apparatus including: a chamber having an interior to which a process gas is supplied, holding means for holding a substrate loaded in the chamber; exciting means for exiting the process gas into plasma; and a baffle plate for partitioning the interior of the chamber into a processing space and an exhausting space, wherein an opening area of an opening made through the baffle plate in a surface of the processing space side is made larger than an opening area in a surface of the exhaustion space side.

According to the present invention, the opening area of the opening in the surface of the processing space side is made larger than the opening area in the surface of the exhaustion space side. With this structure, the opening of the end portion on the process gas introduction side, where deposition materials mostly easily attach, is made wide. Consequently, it requires a longer time until the opening is filled by the deposition of the produced materials during process, and thus the interval between periodical maintenance works of the baffle plate can be prolonged.

Therefore, it becomes possible to carry out the plasma process for a long period of time, thus enabling the improvement of the substrate producing performance. Further, the cost required for the maintenance can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6A is a lateral cross sectional view schematically showing an exhaustion structure within the chamber of a dry processing apparatus according to the third embodiment of the present invention;

FIG. 6B is a cross sectional view taken along line 6A—6A in FIG. 6A;

FIG. 7A is a graph indicating the relationship between the uniformity of the etching rate and the angle of a block plate in the dry processing apparatus;

FIG. 7B is a graph indicating the relationship between the uniformity of the etching rate and the gap made by the block plate in the dry processing apparatus;

DETAILED DESCRIPTION OF THE INVENTION

Embodiments of the present invention will now be described with reference to accompanying drawings.

The film forming apparatus, that is, a dry processing apparatus, used here is of a generally and widely used type, in which a low-pressure process gas serving as a raw material is introduced to a chamber (reaction chamber), and electrical energy is applied there to create a plasma state, which causes a reaction to form a thin film on a substrate.

Figure 1:
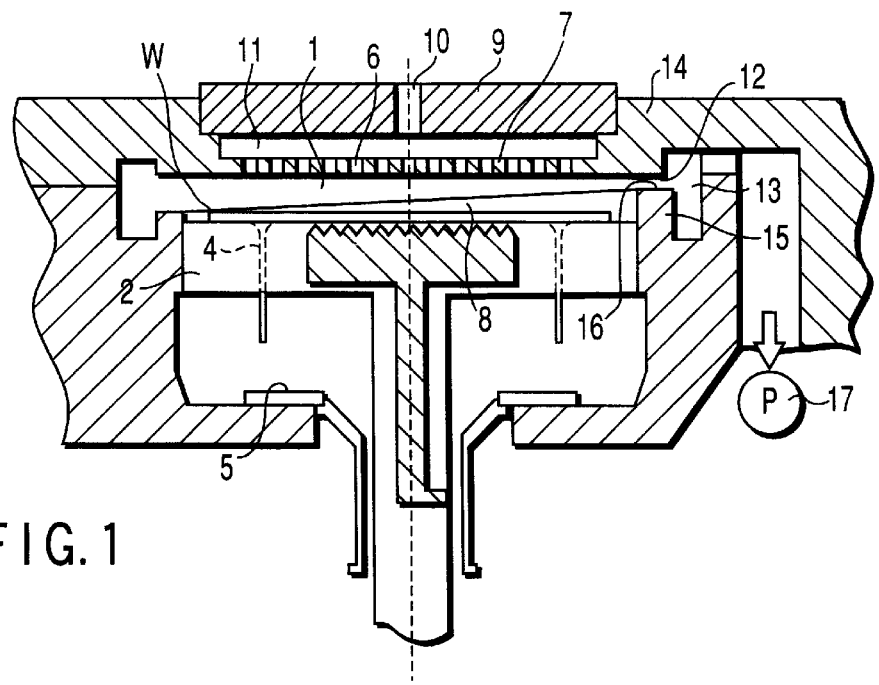
FIG. 1 is a lateral cross sectional view of a dry processing apparatus according to the first embodiment of the present invention.

As can be seen in the lateral cross sectional view shown in FIG. 1, a chamber 1, which is a vacuum container, has a lower electrode (holding means) 2 built in its inside. The lower electrode 2 serves to support a wafer W placed at a predetermined position thereof, so that the wafer W is subjected to a process of depositing a thin film on the support surface by the CVD process.

The lower electrode 2 is provided with retractable lift pins 4. The upper end of each lift pin 4 is formed into a conical head so that it does not drop off. The lower end of the lift pin 4 is made engageable with a lift ring 5 which can be moved in a vertical direction, and therefore it can lift the wafer W upwards over the surface of the lower electrode 2.

The lower electrode 2 is movable in the vertical direction, and moves together with the lift pins 4 and the rift rings 5. Then, a robot hand, which is not shown, transfers the wafer W into the chamber 1, and the lift pins 4 pick the wafer up from the robot hand. After that, the lower electrode 2 moves up or the lift pins 4 move down, to place the wafer W on the supporting surface.

On the side opposing to the lower electrode 2 in the chamber 1, a shower head (supply means) 7 having a great number of transmission holes 6 made therein is provided so as to spray a process gas onto the wafer W placed on the lower electrode 2. With the shower head 7, a process gas such as TEOS gas supplied from the process gas source, which is not shown, passes through the transmission holes 6 in the direction towards the wafer W, and flows into a process space 8.

More specifically, the process gas is allowed to pass through a gas inlet 10 made at a center of a cover plate 9 for the gas supply, and flows into a disk-like manifold 11. Then, the gas is sprayed via the transmission holes 6 of the shower head 7, into the processing space 8 situated between the shower head 7 and the lower electrode 2, so that it reacts on the surface of the wafer W placed on the lower electrode 2.

With the above-described structure, byproducts such as the unreacted portion of the process gas and dusts generated by the reaction flow downwards in the radial direction of the lower electrode 2, and then pass through a pumping gap section (communicating section) 12 which surrounds the upper peripheral section of the lower electrode 2, to flow into a ring-like pumping channel (exhaustion flow path) 13. The upper edge of the inner side of the pumping channel 13 is formed of an isolator ring 14 made of an electrical insulating material containing ceramic and other materials, so as to isolate the metal-made shower head 7 from the main body of the chamber 1.

Figure 2:
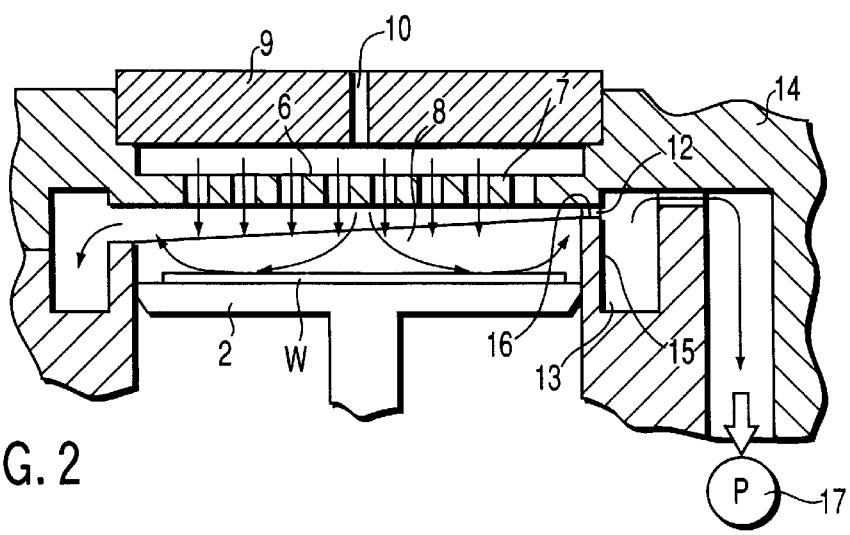
FIG. 2 is a lateral cross sectional view of a structure of a section in a vicinity of a communicating section in the dry processing apparatus.

The flow of the process gas in the vicinity of the pumping gap portion 12 will now be described in further detail with reference to FIG. 2. The pumping gap portion 12 is formed between the isolator ring 14 and a peak portion 16 of a liner 15 provided adjacent to and underneath the isolator ring 14 to oppose thereto. The approaching distance from the liner 15 with respect to the isolator ring 14 is set to be different from an exhaust pump (exhaust means) 17 side to the opposite side. In this manner, the gap width of the pumping gap portion 12 is set to vary from one place to another.

More specifically, the gap width on the exhaust pump 17 side is narrower than that of the opposite side, and the ratio between the gap widths between the exhaust pump 17 side and the opposite side is set to about 2:5. Consequently, the gas amount which can pass the pumping gap portion 12 is made to differ from one section to another in the portion. Further, the pumping gap portion 12 is formed in a slope manner which is directed from the exhaust pump 17 side to the opposite side. This structure may not be a slope depending upon the situation, but it may be a stepwise manner which varies in a plurality of steps. Furthermore, with a combination of a stepwise structure and a slope structure, a similar effect can be obtained.

Figure 3A:
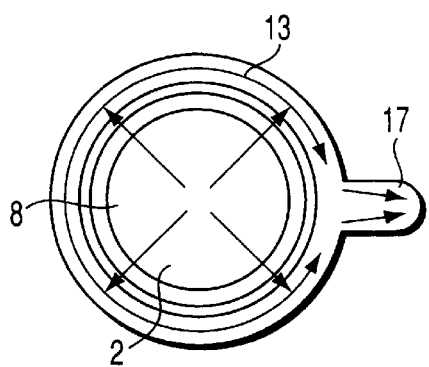
FIGS. 3A and 3B are explanatory views showing the flow of a process gas during the formation of a film in the dry processing apparatus.
Figure 3B:
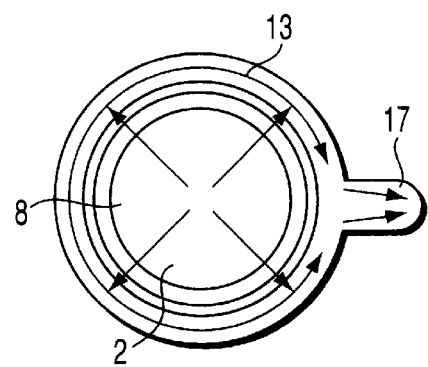

The following is an explanation of the flow of the process has from the processing space 8 to the pumping channel 13 with the above-described structure. In usual cases of the dry processing apparatus, the distance between the shower head 7 and the lower electrode 2 is made to differ between the film forming operation and the cleaning operation. More specifically, during the cleaning, the distance is widened, and a large amount of gas such as $C_2F_6$ is allowed to flow. With the above-described structure, the flow of the process gas during the film formation is as shown in FIG. 3A, that is, the gas is allowed to flow from the processing space 8 through the pumping channel 13 towards the exhaust pump 17, whereas during the cleaning, the gas flows as shown in FIG. 3B, from the processing space 8 through the pumping channel 13 towards the exhaust pump 17. As is clear from both figures, in both cases, the radial gas flow from the central portion of the lower electrode 2 towards the outer circumference is created in the processing space 8, and the process gas is supplied uniformly in the entire pumping channel 13 via the pumping gap portion 12.

Therefore, when the interior of the pumping channel 13 is cleaned, it can be carried out evenly. Further, the process gas flow uniformly in every part within the pumping channel 13, and therefore the cleaning of each part proceeds uniformly. Therefore, the cleaning time can be shortened. The cleaning is carried out usually for every two or three wafer processing operations, and therefore the shortening of the cleaning time greatly contributes to the performance of the dry processing apparatus.

It should be noted that the peak portion 16 of the liner 15 by which the process gas is guided, is appropriately rounded, and therefore the flow of the process gas and the like can be guided smoothly in a laminar flow fashion.

The dry processing apparatus shown in FIG. 1 is driven at two modes, namely, a heat mode and plasma promotion mode. In the heat mode, the power source supplies a power to a resistance heater which is provided on an upper portion of the lower electrode 2 but not shown in the figure, so as to heat the lower electrode 2 and the wafer W placed thereon up to such a temperature that can thermally activate the CVD deposition reaction.

By contrast, in the plasma promotion mode, the RF power source is electrically connected to the metal-made shower head 7 by a switch which is not shown, and therefore the shower head 7 starts to function as an upper electrode. The shower head 7 is usually electrically insulated from the main body of the chamber 1 by the isolator ring 14 having a ring shape, made of non-conductive ceramic. The lower electrode 2 is connected to a bias element associated with the RF power, and the RF power is divided by the shower head 7 and the lower electrode 2.

In this manner, a sufficient voltage and power is applied from the RF power source for electrical discharge so as to generate plasma in the processing space 8 made between the shower head 7 and the lower electrode 2, from the process gas.

With the above-described structure, the height of the pumping gap portion 12 is made to vary from the exhaust pump 17 side to the opposite side, and thus a difference is created in terms of the area through which the gas can pass. In this manner, sections in the pumping channel 13, which are not easily cleaned, can be put away. Further, the gas flows smoothly in the pumping channel 13, and therefore the handling of dusts generated can be carried out very much efficiently.

Further, the gas flow in the film formation and that in the cleaning can be made similar to each other, and therefore the time required for the cleaning can be shortened.

Figure 4:
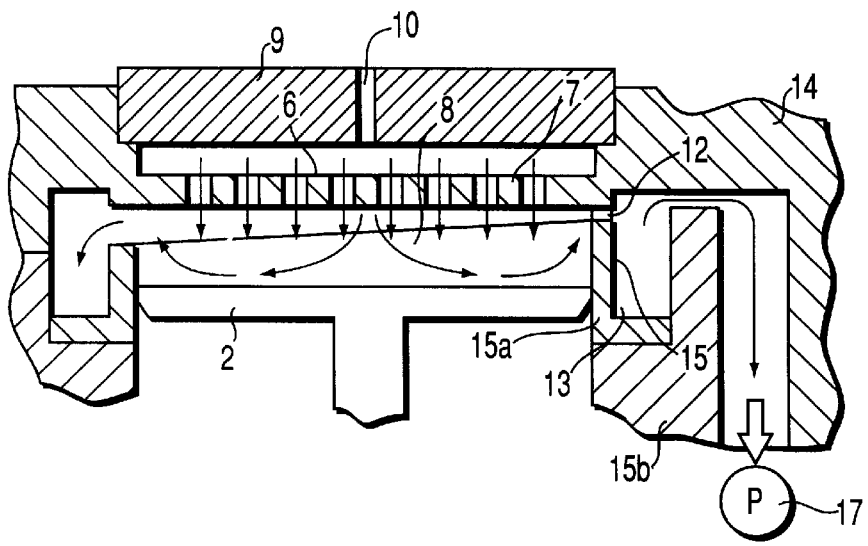
FIG. 4 is a lateral cross sectional view of an alternative version of the structure of the section in the vicinity of the communicating section in the dry processing apparatus.

Alternatively, with such a structure as shown in FIG. 4, that is, the liner 15 which constitutes the pumping channel 13 is made into divisional type of liners 15a and 15b, a similar effect can be obtained. It should be noted that those members of the dry processing apparatus shown in FIG. 4, which are similar to those shown in FIG. 2 are designated by the like reference numerals, and the explanations therefor will not be repeated.

As described above, in the dry process apparatus according to this embodiment, the area of the pumping gap portion 12, through which the process gas can pass, is controlled to vary from the exhaust pump 17 side to the opposite side, and thus the flow during the film formation and that of the cleaning can be made similar. Therefore, the cleaning of sections to be cleaned can be performed assuredly, and the generated dusts can be accurately removed. Further, the time required for these operations can be shortened.

Further, the distance in which dusts created in the space above the wafer during the process pass over the wafer when the gas is exhausted to the ultimate pressure, becomes minimum. At the same time, other wall surfaces than counter electrodes to which deposition materials and particles attached, are separated from the wafer by a slit. Therefore, the probability that dusts adhere to the wafer can be reduced.

According to this embodiment, the height of the liner (the flow area in the pumping gap portion) is fixed; however it may be controlled to have an optimal height for the film formation and cleaning in each time, by providing a variable mechanism.

Next, the dry process apparatus according to the second embodiment of the present invention will now be described.

Figure 5A:
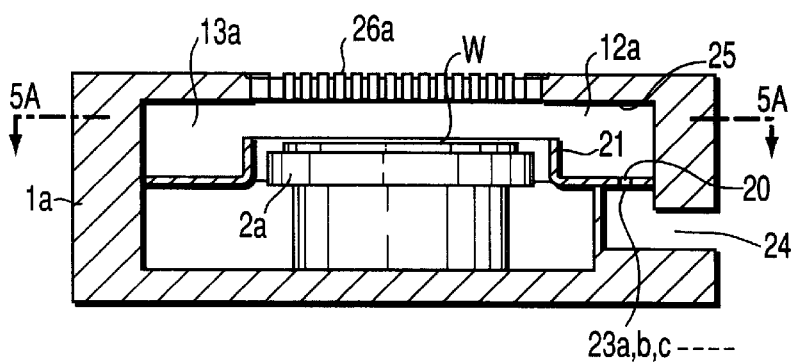
FIG. 5A is a lateral cross sectional view schematically showing an exhaustion structure within the chamber of a dry processing apparatus according to the second embodiment of the present invention.
Figure 5B:
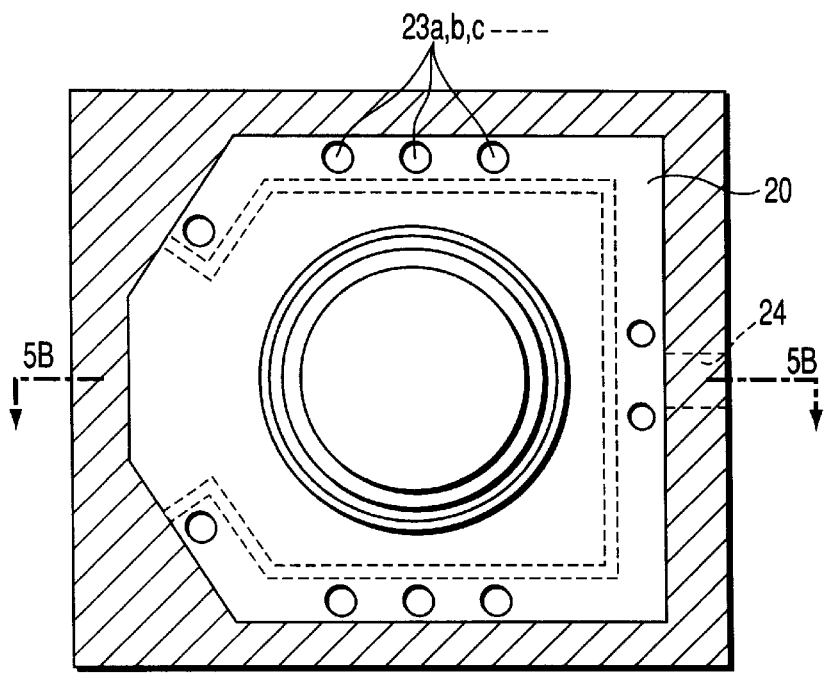
FIG. 5B is a plan view showing the main portion of the section shown in FIG. 5A.

FIG. 5A is a lateral cross sectional view schematically showing the exhaustion structure within the chamber of the present invention, and FIG. 5B is a plan view of the main portion thereof.

That is, underneath an upper electrode 26a of the chamber 1a, a lower electrode (holding means) 2a on which a wafer W is placed and which can move in up-and-down direction, is provided. Exhaust plates 20 are provided around the lower electrode 2a at predetermined intervals. A side of each exhaust plate 20, which is adjacent to the lower electrode 2a is made of a dielectric material such as ceramics, and thus a rise portion 21 to the upper electrode 26a is formed. The tip end of the rise portion 21 is formed to have curved surface in which a slit 12a which constitutes a pumping gap portion is formed to be away from the upper electrode 26a by a predetermined distance (for example, 6 mm). The exhaust flow path 13a is structure by the slit 12, the exhaust plate 20, and inner wall of the chamber 1a. Further, in the exhaust plate 20, there are a plurality of exhaust holes 23a, b, c, . . . , n are provided in its imaginary circumference. Regarding the hole diameters of the exhaust holes 23a, b, c, . . . , n, those of the exhaust opening side 24, which is connected to the exhaust means (not shown), are set to be small (for example, a diameter $\phi$ of 5 mm), and the other portions are set to be larger (for example, a diameter $\phi$ of 8 mm).

With the above-described structure, the process gas which have passed over the upper electrode 26a, and been introduced onto the wafer W placed on the lower electrode 2a, goes through the slit 12a, the exhaust flow path 13a and the exhaust holes 23a, b, c, . . . , n, made in the exhaust plate 20, and then is discharged from the exhaust opening 24. The exhaust holes 23a, b, c, . . . , n are designed to have such a hole diameter and arranged in such a manner that the distribution of the gas flow rate over the wafer W becomes uniform within the surface of the wafer.

Therefore, with this structure, regardless of variations in terms of the process gas used, processing condition, or distance between the upper electrode 26a and wafer W, or the like, an even gas flow rate distribution can be obtained. Further, since the plasma discharge region is limited in the space between the wafer W and the upper electrode 26a by the slit 12a, the amount of deposition materials deposited on the inner side surface 25 or the like of the upper electrode 26a, which is other than the electrode surface, can be made small.

With the effects above, the time required to the removal of the deposition materials becomes short, and the usage efficiency of the process gas is increased. Further, since the space between the wafer W and the upper electrode 26a and the other space is isolated by the slit 12a, the probability that dusts created by the dropping-off or the likes of the deposition material attached onto the other section than the surface of the upper electrode 26a, for example, the upper surface and the like of the chamber 1a, attach to the wafer W, can be reduced.

More specifically, when the process gas and the like is exhausted to the wafer W at a site corresponding to the downstream of the process gas flow, via the slit 12a made all around the wafer W and a plurality of the exhaustion holes 23a, b, c, . . . , n, the influence by the flow rate distribution which depends upon the position of the exhaust hole 24 on the downstream side to the exhaust plate 20 can be canceled out by the flow straightening effect of the exhaust plate 20. Consequently, the distribution of the flow rate of the process gas which are passing through the slit 12a becomes uniform regardless of the variation in the process gas used, processing condition, structure and pressure.

Further, since the uniform exhaustion is possible regardless of the variation of the pressure, the distance in which dusts created in the space above the wafer W or on the surface of the upper electrode 26a during the process pass over the wafer W when the gas is exhausted to the ultimate pressure, becomes minimum. At the same time, other wall surfaces than the upper electrode 26a to which deposition materials and particles attached, are separated from the wafer W by a slit 12a. Therefore, the probability that dusts adhere to the wafer W can be reduced.

With the effects described above, it can be confirmed actually that the time required for the removal of the deposition materials is shortened, and the amount of dusts adhered to the wafer can be reduced.

Next, a dry processing apparatus according to the third embodiment of the present invention will now be described.

FIG. 6A is a lateral cross sectional view showing an exhaustion structure within the chamber of the plasma CVD apparatus of the present invention, and FIG. 6B is a cross sectional view taken along line 6A—6A in FIG. 6A, as viewed from the direction indicated by the arrow.

A process gas introduced from gas supply openings 27a, b, c, . . . , n of un upper electrode 26b, is allowed to pass over the surface of a wafer W placed on a lower electrode (holding means) 2b, and is exhaust from an exhaust opening 24b, which is communicated to exhaustion means (not shown). It should be note that a block plate 28 is provided above the exhaust opening 24b. The block plate 28 is made of an aluminum plate having a thickness of about 1 mm, which has been subjected to an alumite treatment so as to suppress the alternation of the aluminum surface due to the process gas. The block plate 28 is set in a range of angle θ by which the entire surface of the exhaust opening 24b is covered, that is, for example, 70 to 180, preferably, 100 to 150 degrees. The gap between the plate 28 and the side wall of a chamber 1b is set to, for example, 5 mm or less, with which the gas flow control effect can be obtained.

More specifically, as can be understood from the graph indicating the relationship between the uniformity of the etching rate and the angle θ of the block plate 28, the gas flow rate on the exhaust opening 24a side increases in a region where the angle of the block plate 28 is 70 degrees or less, and in a region where it is 180 degrees or more. As a result, the etching rate becomes higher on the exhaust opening 24b side, and thus the uniformity of the etching rate is disturbed. It should be noted that, of the region where the angle is between 70 and 180 degrees, the uniformity of the etching rate is kept at best particularly in the region where the angle is in a range of 100 to 150 degrees.

Further, as can be understood from the graph indicating the relationship between the uniformity of the etching rate and the gap d of the block plate 28, which was obtained by measuring the uniformity of the etching rate while the gap d was varied when the angle of the block plate 28 is set to 180 degrees, in the region where the gap d is d≦5 mm, the etching rate can be improved significantly.

In the meantime, the block plate 28 is set at a position as far away as possible from a processing space, for example, a position 2 to 3 cm away from the exhaust opening 24b, in order to lessen the influence on the plasma in the processing space. The processing space is partitioned by the block plate 28 into a communication section 12b and an exhaustion flow path 13b. Further, the block plate 28 is electrically connected to the chamber 1b. With this structure, the potential of the plasma is stably maintained, and thus the influence on the plasma can be made small in the processing space.

Figure 8:
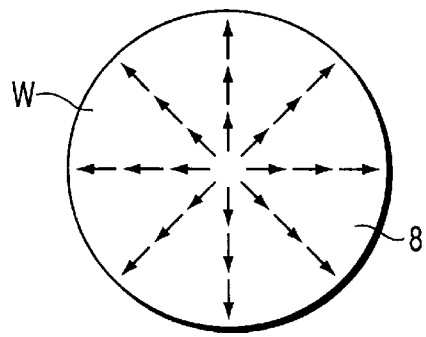
FIG. 8 is an explanatory view showing the flow of a process gas passing over the surface of a wafer in a plasma CVD apparatus of the present invention.
Figure 9:
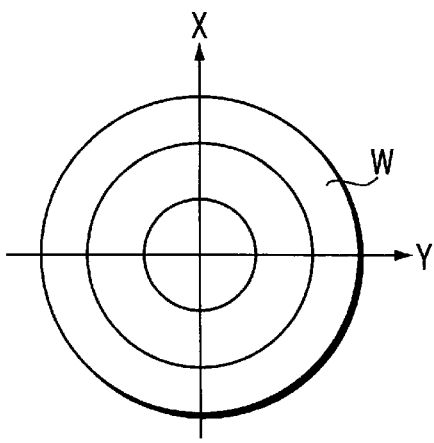
FIG. 9 is an explanatory view showing the etching rate on the surface of a wafer in the plasma CVD apparatus of the present invention.

In the dry processing apparatus of this embodiment, the block plate 28 serves to block the flow the process gas in the direction towards the exhaust opening 24b, and therefore the gas flow in this direction is limited. The process gas flows approximately equally towards the exhaust opening 24b and to the opposite direction, and then it flows to spread coaxially from the center over the wafer W, as shown in FIG. 8. Consequently, the distribution of the etching rate over the surface of the wafer W takes a coaxial fashion as can be seen in FIG. 9, and the uniformity over the surface of the wafer W can be maintained to a variation of 5% or less.

Further, with the block plate 28 provided, the uniformity of the etching rate within the surface can be markedly improved, and therefore the stable process can be assured. Thus, the yield of the apparatus manufacture can be improved.

Figure 10:
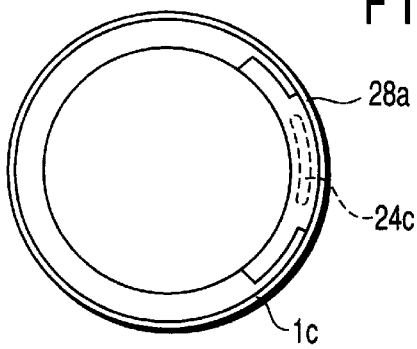
FIG. 10 is a plan view showing an alternative version of the block plate of the present invention.

FIG. 10 shows a differently version of a block plate 28a, which is a type that the gap between the block plate 28a and the chamber 1c is varied in two steps. When the vicinity of the bottom surface of the chamber is observed, the flow of the gas directed downwards for exhaustion is strongest at an exhaust opening 24c, and it becomes weaker as becoming away from the exhaust opening 2c.

In order to further uniform the gas flow, the resistance of the block plate 28a against the flow should be made strong above the exhaust opening 24c, and it should be weakened where it is away from the exhaust opening 24c hole. By using this type of block plate 28a, the uniformity of the flow of the process gas over the surface of the wafer W becomes higher, and a further even etching rate can be obtained within the surface of the wafer W.

With the block plate 28a provided, the variance in terms of the uniformity of the etching rate within the surface can be significantly improved to ±5% or less from about ±10% or less. Thus, the production process is stabilized, and the yield of the apparatus manufacture can be improved.

Further, with use of the block plate 28a, the cleaning which must be carried out in the conventional technique as holes of a flow straightening plate are filled, becomes unnecessary, and therefore the number of maintenance operations for the chamber can be reduced.

Next, the fourth embodiment of the present invention will now be described with reference to FIGS. 11 to 16.

Figure 11:
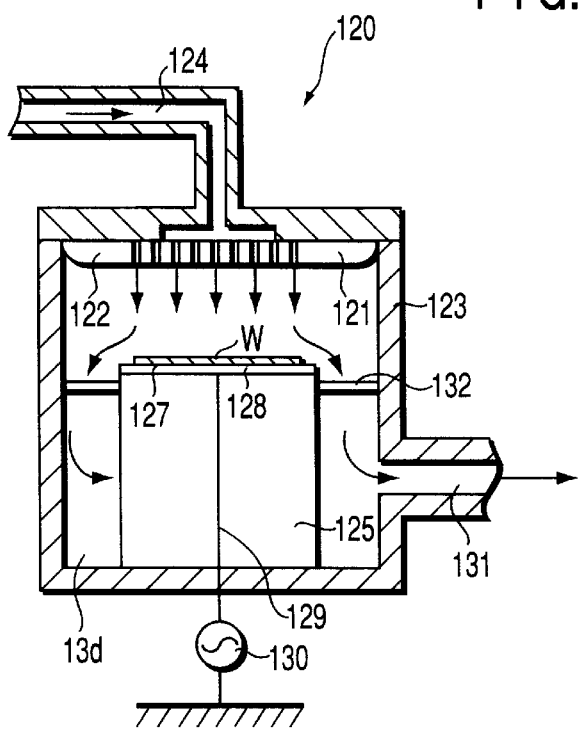
FIG. 11 is a cross sectional view showing an structure of a dry processing apparatus according to the fourth embodiment of the present invention.

FIG. 11 shows a dry processing apparatus 120, an upper end of which is opened, has a chamber 123 in which the open upper end is closed with a top cover 121 having an upper electrode 122. A gas supply pipe path 124 is connected to the top cover 121. The gas supply pipe path 124 has a gas introduction section on the upper electrode 122 side of the top cover 121, which is made to have a larger diameter, and with this structure, the concentration of a process gas introduced to the chamber 123 can be uniformed.

It should be noted that the gas supply pipe path 124 is connected to a gas supply source, which is not shown in the figure, and with this structure, the process gas such as $CF_4$ and $CHF_3$ is introduced to the chamber 123.

In the chamber 123, a processing stage 125 is provided. The processing stage 125 is formed to project out towards the open upper end of the chamber 123 by a predetermined height from the bottom surface of the chamber 123. Thus, the upper end surface of the process stage 125 serves as a substrate holding surface(holding means) 127 on which a substrate such as a semiconductor wafer or a liquid crystal substrate is placed.

The substrate holing surface 127 is provided as a lower electrode 128 for applying an appropriate voltage to a wafer W. A wire 129 is connected to the lower electrode 128 and the wire 129 is electrically connected to an RF power source 130 provided outside the chamber 123. Therefore, when the RF power source 130 is operated, a high-frequency voltage can be applied to the wafer W.

At a certain position in the lower section of the chamber 123 which is communicated to the exhaustion flow path 13d, and opposes to a lateral surface of the processing stage 125, a gas exhaustion pipe path 131 is connected. The gas exhaustion pipe path 131 is connected to a exhaustion means, which is not shown but provided outside the chamber 123, and thus the interior of the chamber 123 can be vacuum-suctioned.

Figure 12:
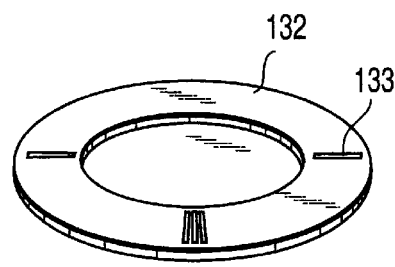
FIG. 12 is a plan view showing the shape of a baffle plate built in the dry processing apparatus.

A ring-shaped baffle plate 132 as shown in FIG. 12 is provided at a site between the processing stage 125 and the inner wall surface of the chamber 123, which is on the gas supply pipe path 124 side (upper side, communicating means) with respect to the gas exhaust pipe path 131, in such a manner that the baffle plate 132 fills the site without any gap. With this structure, plasma can be prevented from entering the gas exhaust pipe path 131 side, and at the same time, the bias of the gas flow at the area where the gas exhaust pipe path 131 is provided, can be suppressed to uniform the flow.

In the baffle plate 132, slits 133 are made. The slits 133 are directed outwards in the radial direction of the baffle plate 132, and formed over the entire width in the circumferential direction of the baffle plate 132 at a predetermined pitch (in this embodiment, a pitch of 1 degree).

Figure 13:
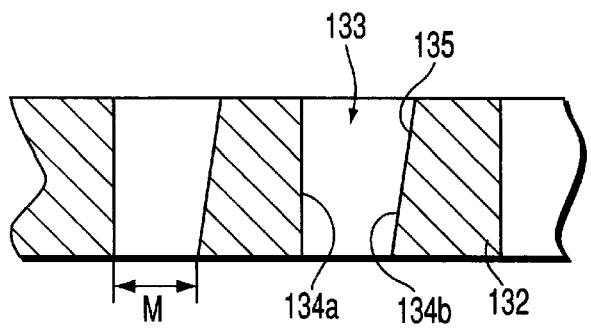
FIG. 13 is a view showing a cross sectional shape of the baffle plate.

The cross section of the baffle plate 132 is shown in FIG. 13. The slit 133 is formed such that the slit width of the upper side is wider, and the slit width on the lower side is narrower. Here, each slit 133 is defined by slit wall surfaces 134a and 134b, and one slit wall surface 134a is made to be vertical with respect to the front and rear surfaces of the baffle plate 132, whereas the other slit wall surface 134b is made to form a tapered wall surface 135. In other words, the other slit wall surface 134b is made to be inclined by a predetermined angle with respect to the front and rear surfaces of the baffle plate 132, in such a manner that the slit width on the upper side becomes larger.

The inclined angle of the slit wall surface 134b is set to be about 80 degrees or less with respect to the rear surface of the baffle plate 132. In other words, if the inclination is by an angle close to perpendicular, the operational effect of the present invention, which will be explained later, cannot be achieved easily, and therefore the inclined angle is set so that it does not become the wall surface is close to perpendicular.

Further, the slit width M on the lower end takes the minimum width of the slit 133, and this width is set to be no more than twice the sheath width of plasma. The sheath width is about 3 to 10 times large as Debye length $\lambda$ of plasma, and in the case of a magnetron RIE apparatus, for example, it is about 1 mm.

When the slit width M is set as described above, the concentration of the process gas within the chamber 123 can be made uniform. Therefore, the exhaustion of the process gas from the chamber 123 can be uniformly carried out. At the same time, the plasma can be prevented from passing through the slit 133 and being exhausted from the gas exhaust pipe path 131.

Here, the Debye length $\lambda$ is defined by the following formula:

$$\lambda = (kT_e/n_e e^2)^{1/2},$$

where: k; Bolzmann's constant, $T_e$; electron temperature, $n_e$; electron density, and e; charge.

The operation of the dry processing apparatus 120 having the above-described structure will now be described.

A wafer W is placed on the processing stage 125, and the interior of the chamber 123 is vacuum-suctioned to a predetermined pressure while a predetermined amount of the process gas is supplied into the chamber 123. After the supply of the process gas, the RF power source 130 is operated to apply a predetermined voltage to the above-described lower electrode 128, thus starting the plasma processing of the wafer W.

Then, the process gas introduced to the chamber 123 is made into plasma by the voltage application from the RF power source 130, and the process gas such as $CF_4$ and $CHF_3$ serves as activated species. When the activated species is created, the species is urged to proceed towards the lower electrode 128 applied with a predetermined potential from the RF power source 130.

In this manner, the activated species collides with the wafer W, and thus a plasma processing operation such as anisotropic etching can be carried out on the wafer W from the direction of the proceeding of the activated species.

When the activated species collides with the wafer W, a product material 136 such as fluorocarbon is formed upon the collision. Then, the product material 136 is scattered within the chamber 123, and the material 136 adheres to the baffle plate 132 as the vacuum suction takes place in the gas exhaust pipe path 131.

Figure 14:
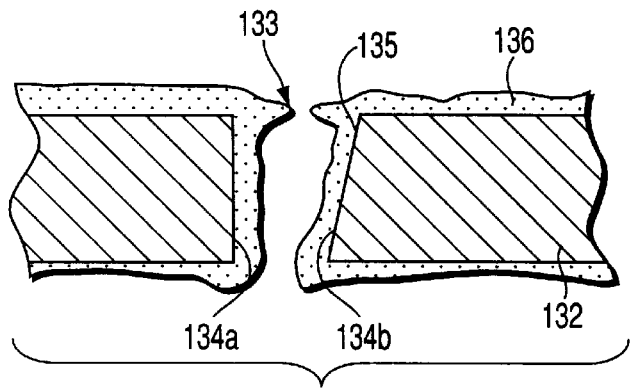
FIG. 14 is a schematic view showing the state of the attachment of product materials in a vicinity of a slit of the baffle plate.

The manner of the product material 136 adhering to the baffle plate 132 is shown in FIG. 14. In general cases, the product material 136 adheres more on the upper end side of the slit 133 and the lower end side of the tapered wall surface 135. This is because the upper end of the slit wall surface 134a and the upper end of the other slit wall surface 134b are an opening section of the slit 133, where the collision of the air flow which contains the product material 136 easily occur for the first time in the slit 133. Also, at the opening section of the slit 133, the air flow is disturbed. Therefore, the product material 136 mostly adheres to this portion.

In the meantime, the reason why the material adheres in a great amount to the lower end side of the tapered wall surface 135 is that the product material 136 adhered to the further up section of the tapered wall surface 135 slides down to the lower end side to be concentrated.

Therefore, in the present invention, the shape of the slit is made such that the upper end side of the slit 133 is made wider, so as to prolong the time for filling the slit by the attachment of the product material 136. Further, the tapered wall surface 135 is formed only on the other slit wall surface 134b, and thus there is only one section where the product material is easily attached and concentrated.

With the above-described structure, the upper end side of the slit 133 is made wider than that of the conventional technique. Therefore, the time for the slit 133 being filled as the product material 136 attached to the upper end of one slit wall surface 134a is connected to that attached to the upper end of the other slit wall surface 134b, becomes loner, thus making it possible to prolong the interval between maintenances for the baffle plate 132.

Further, even if there is attachment of the product material 136 at the lower end of one slit wall surface 134a and the lower end of the other slit wall surface 134b, the amount of the product material 136 attached is less as compared to the case of the upper end of one slit wall surface 134a and the upper end of the other slit wall surface 134b. Therefore, as compared to the structure of the conventional technique, where the upper end of the slit 133, to which the product material 136 easily attaches, is made narrow, the present invention is able to avoid the drawback that the slit 133 is closed as the product material 136 is filled therein.

As described above, the interval between maintenance operations for the baffle plate 132 is prolonged, and therefore the plasma processing can be carried out for a long period of time, thus making it possible to enhance the performance of producing wafers W.

Further, the interval of maintenance operations is made longer, and therefore the frequency of the maintenance can be reduced, thereby enabling the reduction of the cost required to the maintenance.

Figure 15:
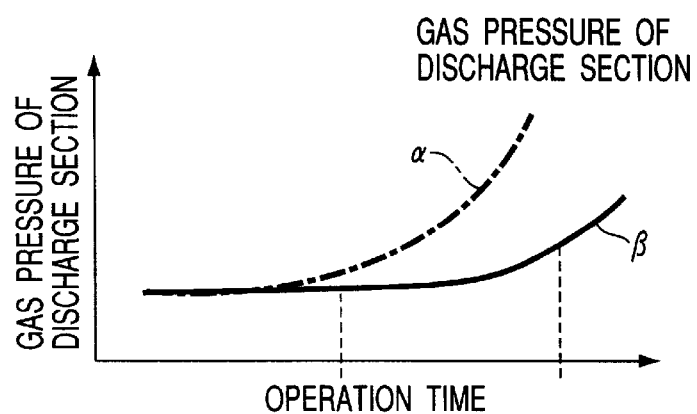
FIG. 15 is a graph indicating the relationship between the operation time and the gas pressure in a discharge section in the dry processing apparatus.

Furthermore, since the time for the slit 133 being closed up is long, the increase in the gas pressure in the chamber 123 can be suppressed. The result of an experiment which verifies the suppression of the increase in the gas pressure is shown in FIG. 15. In this figure, $\alpha$ is a graph indicating the relationship between the operation time of the conventional dry processing apparatus and the gas pressure of the discharge portion, and $\beta$ is a graph indicating the relationship between the operation time of the dry processing apparatus of the present invention and the gas pressure of the discharge portion.

As is clear from these graphs, it takes a longer time for the gas pressure to change in the case of the dry processing apparatus 120 of the present invention, and therefore it becomes possible to process a more stable wafer W within the chamber 123.

Figure 16:
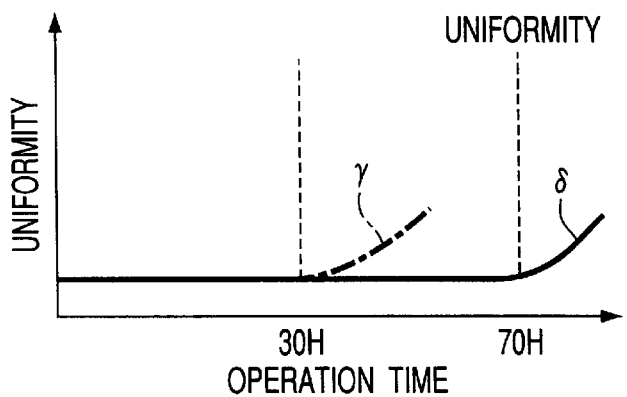
FIG. 16 is a graph indicating the relationship between the operation time and the uniformity of the etching rate in the dry processing apparatus.

The result of an experiment which verifies the improvement of the uniformity in the etching process for the wafer W is shown in FIG. 16. In this figure, $\gamma$ is a graph indicating the relationship between the operation time of the conventional dry processing apparatus and the uniformity of the etching, and δ is a graph indicating the relationship between the operation time of the dry processing apparatus 120 of the present invention and the uniformity of the etching. As is clear from these graphs, it is possible to carry out a more uniform etching process in the case of the dry processing apparatus 120 of the present invention.

An embodiment of the present invention has been described; however the present invention can be modified into various different versions other than the above. The following are explanations for these versions.

Figure 17:
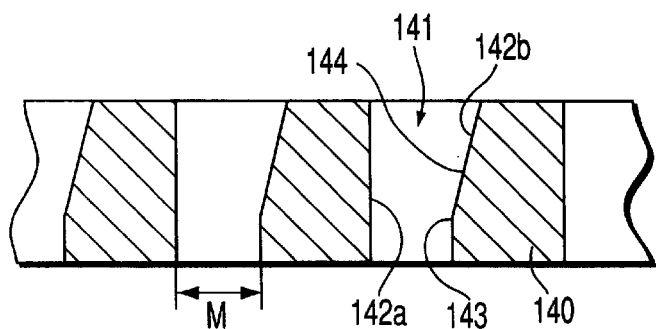
FIG. 17 is a cross sectional view showing the first alternative version of the baffle plate built in the dry processing apparatus.

The above-described embodiment was described in connection with the case where one slit wall surface 134a is made perpendicular, and the other slit wall surface 134b is made inclined; however the slit shape may be changed, and a baffle plate 140 having a slit 141 of a shape shown in FIG. 17 may be used.

Here, one slit wall surface 142a is made vertical to the upper and lower surfaces of the baffle plate 140 as in the case of the slit wall surface 134a shown in FIG. 13, and the other slit wall surface 142b is made to have a different shape from that described above, where a vertical portion 143 which is made approximately vertical to the front or rear surface of the baffle plate 140, is made in the lower end side. It is also possible that the upper side of the vertical portion 143 is formed into a tapered wall surface 144 as in the above-described embodiment. In this case, the width M of the vertical portion 143 has the minimum width in the slit 141, and this portion is set to be no more than two times as large as the sheath thickness.

It should be noted that the slit width M is set to about 1 mm as in the above-described embodiment.

Figure 18:
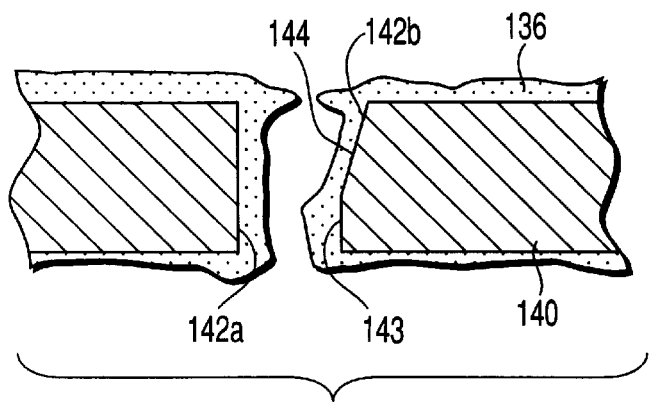
FIG. 18 is a schematic view showing the state of the attachment of product materials in the baffle plate.

The state of the attachment of the product material 136 in the case where the baffle plate 140 is used is shown in FIG. 18. In this slit 141, the upper end of one slit wall surface 142a and the upper end of the other slit wall surface 142b are an opening section of the slit 141, where the collision of the air flow which contains the product material 136 easily occur. Also, at the opening section of the slit 141, the air flow is disturbed. Therefore, the product material 136 mostly adheres to this portion.

However, the opening portion of the slit 141 is formed to be wider as in the case of the embodiment described above, it becomes possible to prolong the time for the opening portion being closed up with the product material 136.

The amount of the product material 136 attached to the lower ends of one slit wall surface 142a and the other slit wall surface 142b is less as compared to that attached to the upper ends of one slit wall surface 142a and the other slit wall surface 142b. Therefore, as in the case of the structure of the above-described embodiment, the slit 133 of the present invention is able to avoid the drawback that the slit is closed up by the attachment of the product material 136, as compared to the conventional structure in which the upper end of the slit, where the product material 136 easily attaches is made narrow.

Further, the lower ends of one slit wall surface 142a and the other slit wall surface 142b are made to have the minimum width though there is the vertical portion 143, and this width is set to be no more than twice as large as the sheath thickness of plasma. Therefore, the exhaustion of the plasma from the slit 141 can be prevented, and the plasma processing of the wafer W can be accurately performed.

In particular, the slit 141 has a structure that includes the vertical portion 143, due to the presence of which, plasma cannot easily go through, thus making it possible to perform the plasma processing of the wafer W in a more stable manner.

Figure 19:
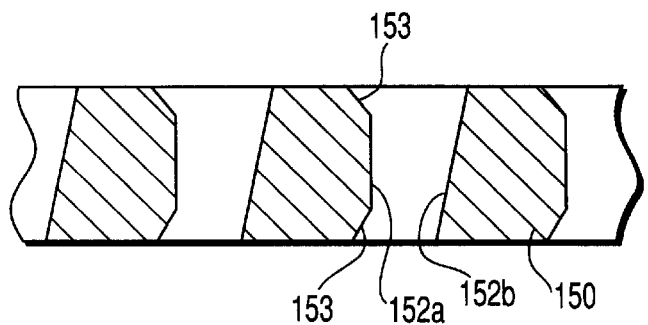
FIG. 19 is a cross sectional view showing the second alternative version of the baffle plate built in the dry processing apparatus.

Apart from the above different versions, there is an alternative example such as a baffle plate 150, for example, shown in FIG. 19, in which edge sections of the upper and lower ends of one slit wall surface 152a, which constitute a slit 151, are removed to made corner portions 153. Here, it is also possible that certain gap widths are created between the upper and lower ends of one slit wall surface 145a and the other slit wall surface 152b by removing the edge portions.

Figure 20:
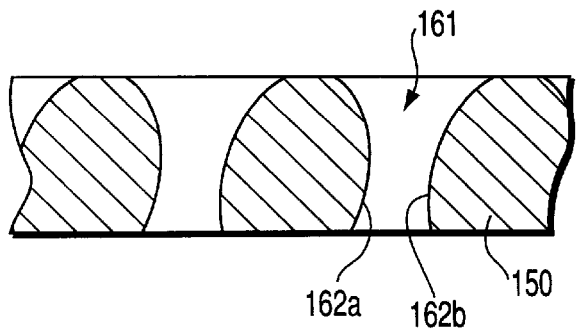
FIG. 20 is a cross sectional view showing the third alternative version of the baffle plate built in the dry processing apparatus.

There is a still further alternative example such as a baffle plate 160 shown in FIG. 20, in which one slit wall surface 162a or the other slit wall surface 162b, which constitutes the slit 161 is formed into a curved surface shape, and the section of the minimum width Q may be located at other site than the upper end section of one slit wall surface 162a or the other slit wall surface 162b.

Figure 21:
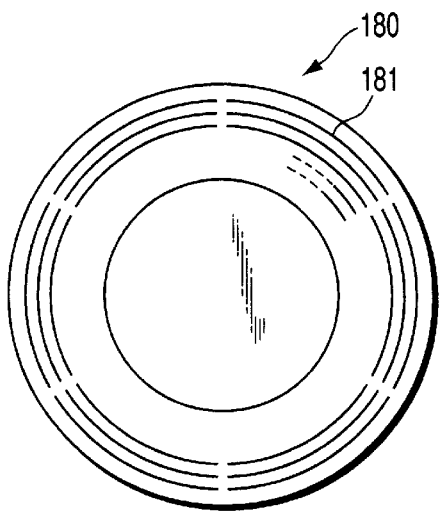
FIG. 21 is a plan view showing the fourth alternative version of the baffle plate built in the dry processing apparatus.
Figure 22:
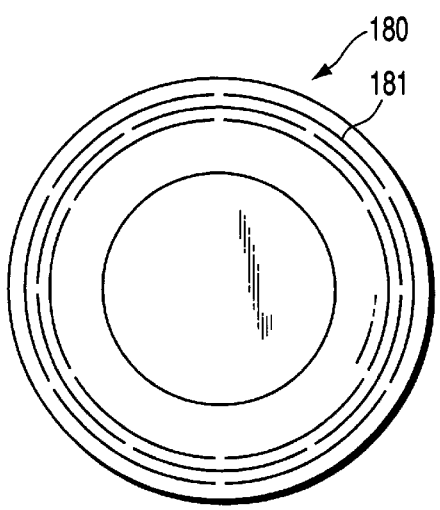
FIG. 22 is a plan view showing the fifth alternative version of the baffle plate built in the dry processing apparatus.

Apart from the above, in the embodiments described above, each slit made in the baffle plate 132 is formed to be directed outwards in the radial direction from the center of the baffle plate 132; however it is possible as in a baffle plate 180 shown in FIG. 21 or 22, to form a slit 181 in a circumferential direction of the baffle plate 180.

Here, in the structure shown in FIG. 21, a plurality of slits 181 are formed in the circumferential direction in rows, and the rows of the slits 181 are alternately deviated by half a pitch from each other.

Further, in the structure of FIG. 22, a plurality of slits 181 are formed in the circumferential direction in rows and the rows of the slits 181 are alternately deviated by half a pitch from each other, as in the case shown in FIG. 21.

Figure 23A:
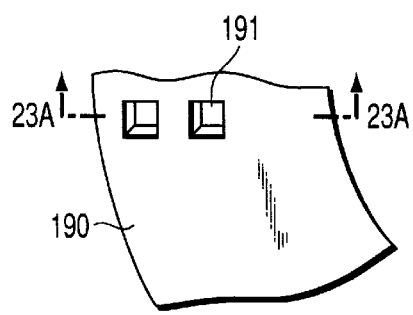
FIG. 23A is a plan view showing the main portion of the sixth alternative version of the baffle plate built in the dry processing apparatus.
Figure 23B:
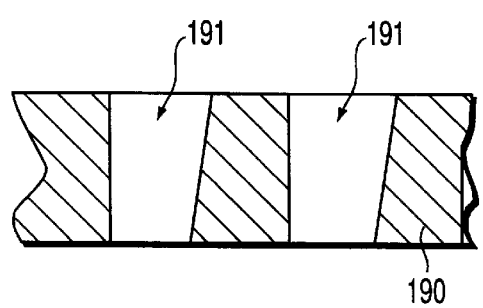
FIG. 23B is a cross sectional view taken along the line 23A—23A in FIG. 23 when viewed from the direction indicated by the arrow.

Further, there is an alternative example such as a baffle plate 190 shown in FIG. 23, in which a great number of punch holes 191 are formed without forming groove-like slits 133. As can be seen in FIGS. 23A and 23B which illustrates a pan view and a cross sectional view taken along the line A—A, the shape of the punch holes 191 is, in a plan view, a rectangular, whereas it is, in a cross sectional view, such a shape that one slit wall surface 192a is set perpendicular to the front and rear surfaces of the baffle plate 190 and the other slit wall surface 192b is formed into a tapered wall surface 193, as in the shape illustrated in FIG. 13. Note that the tapered wall surface 193 is formed to have a symmetrical shape with respect to a trough line P.

FIGS. 24A to 24D are schematic diagrams explaining the reason why the wall surfaces of the slit, which oppose to each other should not be formed to be identical. As described above, when a slit wall surface 202 of a slit 201 of a baffle plate 200 is made vertical, a great amount of the product material 136 attaches to the upper end side, whereas when a slit wall surface 212 of a slit 211 of a baffle plate 210 is made to be tapered, a great amount of the product material 136 attaches to the lower end side.

Figure 24A:
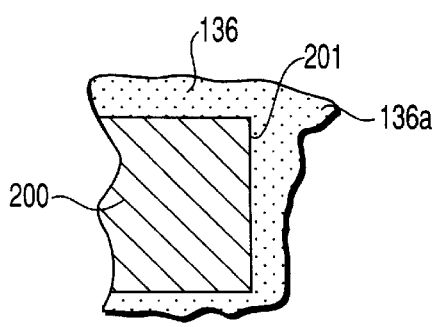
FIG. 24A is an explanatory schematic view illustrating a formation shape of product materials attached to the baffle plate.
Figure 24B:
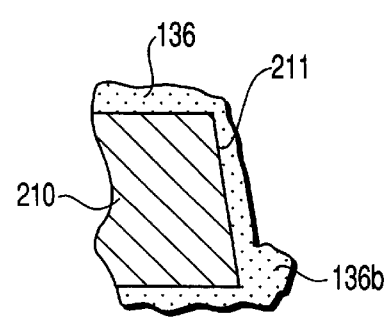
FIG. 24B is an explanatory schematic view illustrating a formation shape of product materials attached to the baffle plate.
Figures 24C, 24D:
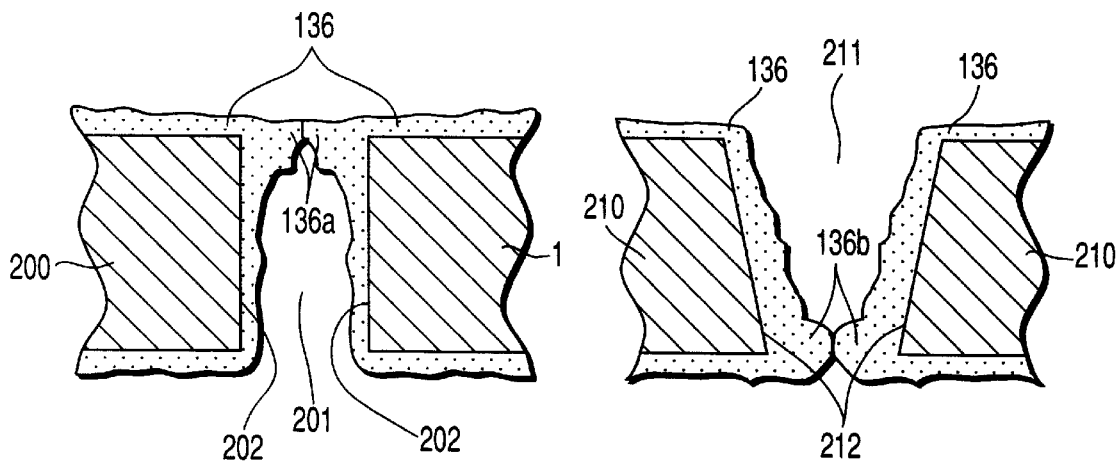
FIG. 24C is an explanatory schematic view illustrating a formation shape of product materials attached to the baffle plate.
FIG. 24D is an explanatory schematic view illustrating a formation shape of product materials attached to the baffle plate.
Figure 25:
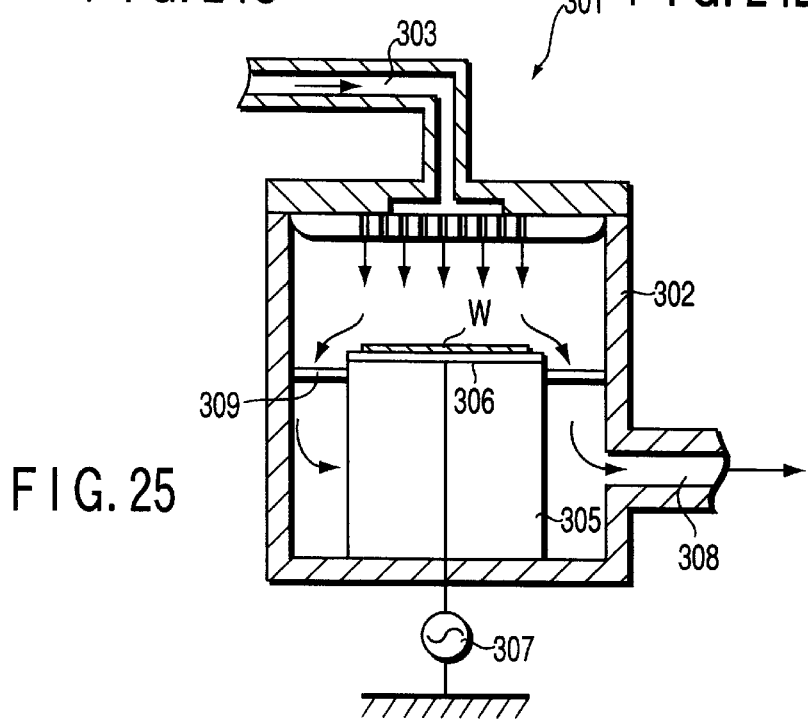
FIG. 25 is a lateral cross sectional view showing an structure of a dry processing apparatus according to a conventional technique.
Figures 26, 27:
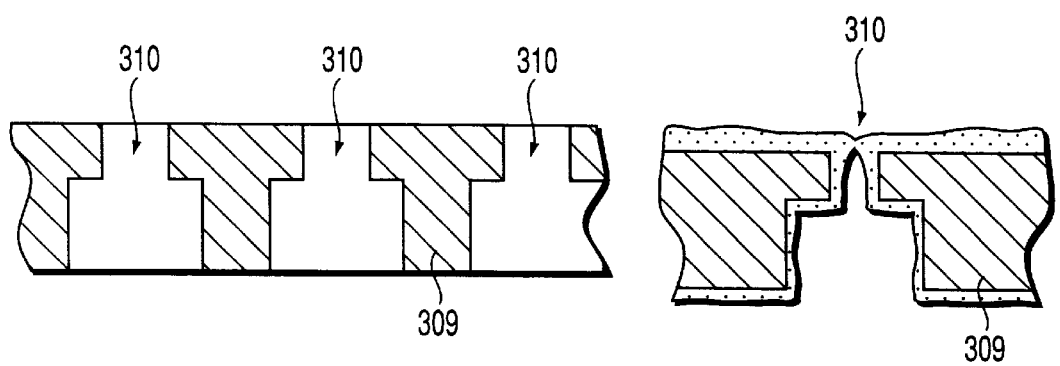
FIG. 26 is a cross sectional view showing the main part of a baffle plate built in the dry processing apparatus shown in FIG. 25.
FIG. 27 is a schematic view illustrating a formation shape of product materials attached to the baffle plate.

As a result, when the slit wall surfaces 202 opposing to each other are vertical to the surface of the baffle plate as shown in FIG. 24C, the product material portions 136a attached to the both upper ends are connected to each other, thus closing up the slit 201. Further, when the slit wall surfaces 202 opposing to each other are made to be tapered as shown in FIG. 24D, the product material portions 136a attached to the both lower ends are connected to each other, thus closing up the slit 211.

As described above, according to the dry processing apparatus 120 of the present invention, the process gas introduction side of the opening section of the slit is made wider than that of the gas exhaustion side, and therefore the slit width of the gas introduction end side, where the product material is mostly easily attached, becomes wider.

Therefore, the time for the slit being closed by the attachment of the product material becomes loner, thus making it possible to prolong the interval between maintenance operations for the baffle plate.

Therefore, the plasma processing can be carried out for a long period of time, thus making it possible to enhance the performance of producing substrates. Further, the cost required to the maintenance can be reduced.

Lastly, the present invention is not limited to the above-described embodiments and versions, and as long as the essence of the invention remains, it can be naturally remodeled into various different versions.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A dry processing apparatus comprising:

holding means for holding a substrate to be processed in a chamber;

supply means for supplying a process gas into the chamber;

exhaustion means for exhausting the chamber through an exhaustion outlet formed in the chamber; and a baffle plate for partitioning an inside of the chamber into a processing space in which the supply means is provided and an exhaustion space which is closer to the exhaustion outlet than the processing space, wherein the baffle plate includes opening portions which are formed such that an opening area of each of the opening portions which are located on a processing-space side is greater than an opening area of said each opening portion which is located on an exhaustion-space side, and at least a part of said each opening portion is constituted by a side wall inclined with respect to a surface of the opening portion which is located on the processing space side or the exhaustion-space side.

2. A dry processing apparatus according to claim 1, wherein said each opening portion is formed in a shape of a slit extending in a radial direction of the baffle plate.

3. A dry processing apparatus according to claim 1, herein the side wall is inclined to have a vertical surface which is located on the exhaustion-space side, and extends perpendicular to the surface of the baffle plate.

4. A dry processing apparatus according to claim 1, wherein the side wall has a chamfered opening end portion.

5. A dry processing apparatus according to claim 1, wherein the side wall is inclined to be curved.

6. A dry processing apparatus according to claim 1, wherein said each opening portion is formed in the shape of a slit extending in a circumferential direction of the baffle plate.

7. A dry processing apparatus according to claim 1, wherein said each opening portion is formed in the shape of a punch-out hole.

* * * * *